US011733809B2

(12) United States Patent
Feng et al.

(10) Patent No.: US 11,733,809 B2
(45) Date of Patent: Aug. 22, 2023

(54) TOUCH DETECTION DEVICE

(71) Applicant: Tyco Electronics (Shanghai) Co. Ltd., Shanghai (CN)

(72) Inventors: Yulin Feng, Shanghai (CN); Yuming Song, Shanghai (CN); Jin Chen, Shanghai (CN); Yifeng Jiang, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/239,827

(22) Filed: Apr. 26, 2021

(65) Prior Publication Data
US 2021/0240299 A1 Aug. 5, 2021

Related U.S. Application Data

(63) Continuation of application No. PCT/EP2019/079211, filed on Oct. 25, 2019.

(30) Foreign Application Priority Data

Oct. 26, 2018 (CN) .......................... 201811258140.3

(51) Int. Cl.
*G06F 3/043* (2006.01)
*G06F 3/041* (2006.01)
(52) U.S. Cl.
CPC ........ *G06F 3/0436* (2013.01); *G06F 3/04182* (2019.05); *G06F 3/04186* (2019.05)

(58) Field of Classification Search
CPC ............... G06F 3/0436; G06F 3/04182; G06F 3/04186; G06F 3/0418; G06F 3/043; G06F 3/0414; G06F 3/0416; H03K 17/964
See application file for complete search history.

(56) References Cited

U.S. PATENT DOCUMENTS

| 9,720,544 B2 | 8/2017 | Westerman |
| 10,599,250 B2 | 3/2020 | Harrison et al. |
| 2006/0144154 A1 | 7/2006 | Ueno et al. |

(Continued)

FOREIGN PATENT DOCUMENTS

| CN | 103455200 A | 12/2013 |
| CN | 103645845 A | 3/2014 |

(Continued)

OTHER PUBLICATIONS

PCT Notification, International Search Report and the Written Opinion of the International Searching Authority, dated Dec. 10, 2019, 16 pages.

(Continued)

*Primary Examiner* — Amit Chatly
(74) *Attorney, Agent, or Firm* — Barley Snyder

(57) ABSTRACT

A touch detection device includes a touch panel, a piezoelectric sensor mounted on the touch panel for detecting a tap event applied to the touch panel, and a control circuit board in electrical communication with the piezoelectric sensor. The control circuit board includes a signal processing circuit for processing a detection signal output from the piezoelectric sensor, and a controller for determining whether the tap event is a correct human finger tap event based on the processed detection signal.

20 Claims, 5 Drawing Sheets

(56) References Cited

U.S. PATENT DOCUMENTS

| | | |
|---|---|---|
| 2006/0232558 A1 | 10/2006 | Chien |
| 2010/0253648 A1 | 10/2010 | St. Pierre |
| 2011/0018825 A1* | 1/2011 | Kondo ................ G06F 3/043 345/173 |
| 2014/0043295 A1* | 2/2014 | Alameh ............... G06F 3/041 345/173 |
| 2014/0327626 A1 | 11/2014 | Harrison et al. |
| 2015/0035759 A1 | 2/2015 | Harrison et al. |
| 2015/0346903 A1 | 12/2015 | O'Connor |
| 2016/0110005 A1 | 4/2016 | Yin et al. |
| 2016/0299621 A1 | 10/2016 | Sah et al. |
| 2018/0059857 A1* | 3/2018 | Kumada ............. G06F 3/0234 |
| 2019/0102001 A1 | 4/2019 | O'Connor |
| 2020/0356216 A1* | 11/2020 | Yamamoto .......... G06F 3/0414 |

FOREIGN PATENT DOCUMENTS

| | | |
|---|---|---|
| CN | 104769533 B | 7/2015 |
| CN | 105320436 A | 2/2016 |
| CN | 105431799 A | 3/2016 |
| CN | 108803933 B | 6/2021 |
| WO | 2007035896 A2 | 3/2007 |
| WO | 2007035896 A3 | 3/2007 |
| WO | 2013059488 A1 | 4/2013 |
| WO | 2017028786 A1 | 2/2017 |

OTHER PUBLICATIONS

Extended European Search Report dated Oct. 27, 2022 in Application No. 19 794 545,4-1224, 8 pages.

First Office Action from the National Intellectual Property Office dated Mar. 31, 2023 (with English Translation thereof), corresponding to Application No. 2018112581403, 13 pages.

* cited by examiner

TOUCH DETECTION DEVICE

CROSS-REFERENCE TO RELATED APPLICATIONS

This application is a continuation of PCT International Application No. PCT/EP2019/079211, filed Oct. 25, 2019, which claims priority under 35 U.S.C. § 119 to Chinese Patent Application No. 201811258140.3 filed on Oct. 26, 2018.

FIELD OF THE INVENTION

The present invention relates to a touch detection device, and more particularly, to a touch detection device comprising a piezoelectric sensor.

BACKGROUND

In order to increase the convenience of controlling a device (for example, household appliances), touch control is a visual and convenient man-to-machine interaction. In the related art, a capacitance touch panel is usually used. However, if the touch area of the device is very large, such as when a whole door of a washing machine or a refrigerator is used as a touch input surface, the cost thereof becomes very high. At the same time, as the capacitance value is changed once the capacitance touch panel is touched, it cannot distinguish the touch force and the touch material. In other words, the capacitance touch panel will be triggered as long as it is touched, which causes false triggers. In some conditions, an input instruction to control the device is defined as an event of tapping or touching a surface of the device with a specific finger part, such as finger joint or fingertip. For example, an input instruction to open a light inside a refrigerator may be defined as a double-click event on the refrigerator door; an input instruction to open a dishwasher may be defined as a tap event on the dishwasher door; an input instruction to open a washer barrel lamp may be defined as a double-click event on the washer door; and an input instruction to open a washer door may be defined as a triple-click event on the washer door.

In addition to the capacitance touch panel, in the related art, there exist other solutions to control the device, for example, using a microphone to detect sound signals or using an acceleration sensor to detect vibration signals. In the case of the microphone to detect sound signals, a closed voice cavity in the device is required. This increases the difficulty of installation of the device, as well as increases costs. In the solution utilizing an acceleration sensor to detect vibration signals, the accelerometer must be mounted on an associated circuit board in a surface mounted manner, and the accelerometer must tightly contact a vibration surface of a vibration plate. When the vibration plate to be contacted is made of transparent material, such as, transparent glass, it is difficult to hide the circuit board, causing significant design challenges.

SUMMARY

A touch detection device includes a touch panel, a piezoelectric sensor mounted on the touch panel and adapted to detect a tap event applied to the touch panel, and a control circuit board in electrical communication with the piezoelectric sensor. The control circuit board includes a signal processing circuit adapted to process a detection signal output from the piezoelectric sensor, and a controller adapted to determine whether the tap event is a correct human finger tap event based on the processed detection signal.

BRIEF DESCRIPTION OF THE DRAWINGS

The invention will now be described by way of example with reference to the accompanying Figures, of which.

DETAILED DESCRIPTION OF THE EMBODIMENTS

Figure 1:
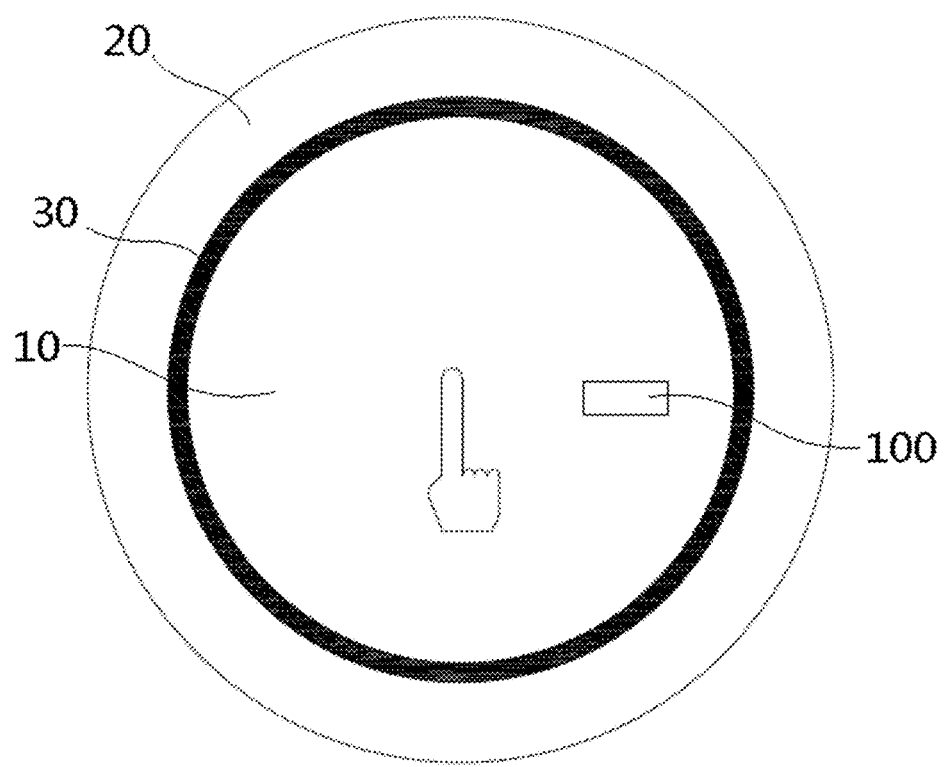
FIG. 1 is an illustrative view of a touch detection device according to an embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an embodiment of the present disclosure, a touch detection device is provided comprising a touch panel, a piezoelectric sensor mounted on the touch panel and adapted to detect a tap or touching event applied to the touch panel, and a control circuit board in electrical communication with the piezoelectric sensor. The control circuit board includes a signal processing circuit adapted to process a detection signal output from the piezoelectric sensor, and a controller adapted to determine whether the tap event is a correct human finger tap event based on the processed detection signal.

Figure 4:
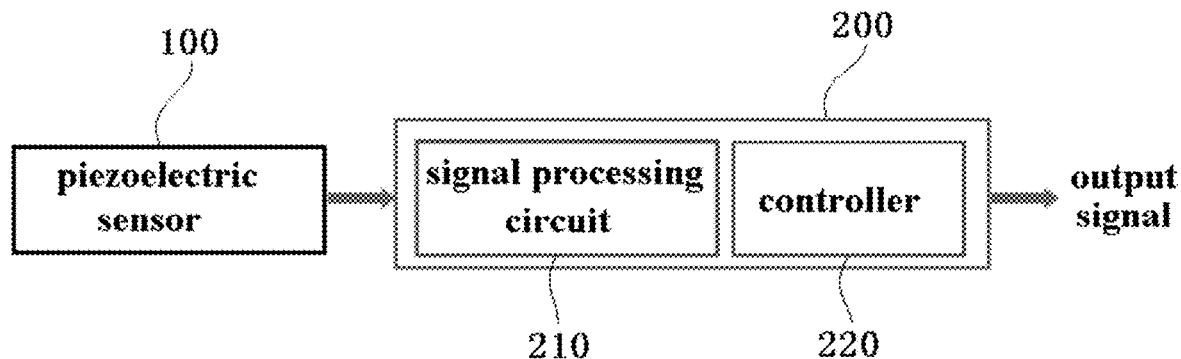
FIG. 4 shows a functional block diagram of a control circuit board of a touch detection device according to an embodiment of the present disclosure.

FIG. 1 is an illustrative view of a touch detection device according to an embodiment of the present disclosure, while FIG. 4 shows a functional block diagram of a control circuit board of a touch detection device according to an embodiment of the present disclosure.

As shown in FIGS. 1 and 4, in an embodiment, the touch detection device includes a touch panel 10, a piezoelectric sensor 100, and a control circuit board 200. The piezoelectric sensor 100 is mounted on the touch panel 10 and is adapted to detect a tap event applied to the touch panel 10. The control circuit board 200 is in electrical communication with the piezoelectric sensor 100. In an embodiment, the piezoelectric sensor 100 is a piezoelectric thin film sensor. However, the piezoelectric sensor may be any other type of piezoelectric sensor made of any suitable piezoelectric induction material. For example, the piezoelectric sensor 100 may be a piezoelectric ceramic sensor made of piezoelectric ceramic.

Figure 5:
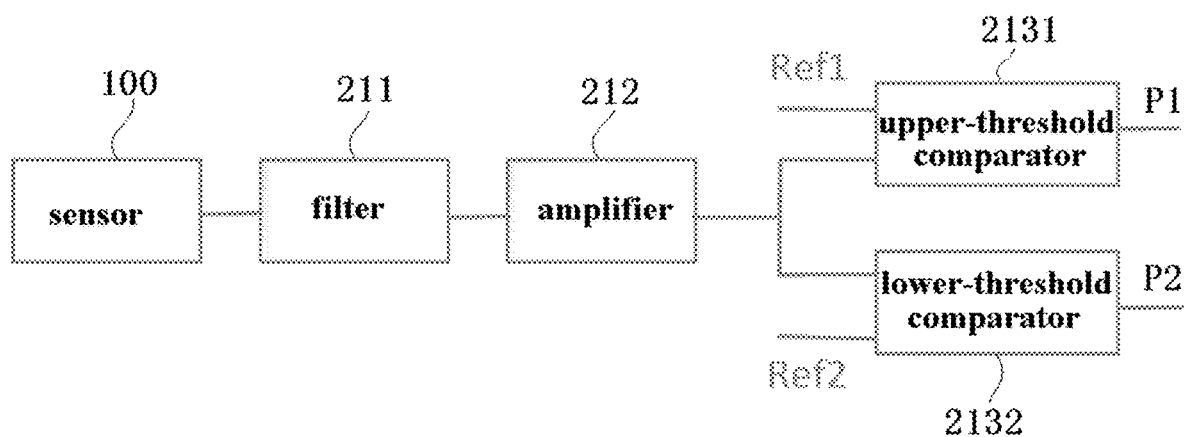
FIG. 5 is an illustrative view of a signal processing circuit of the control circuit board in FIG. 4.
Figure 6:
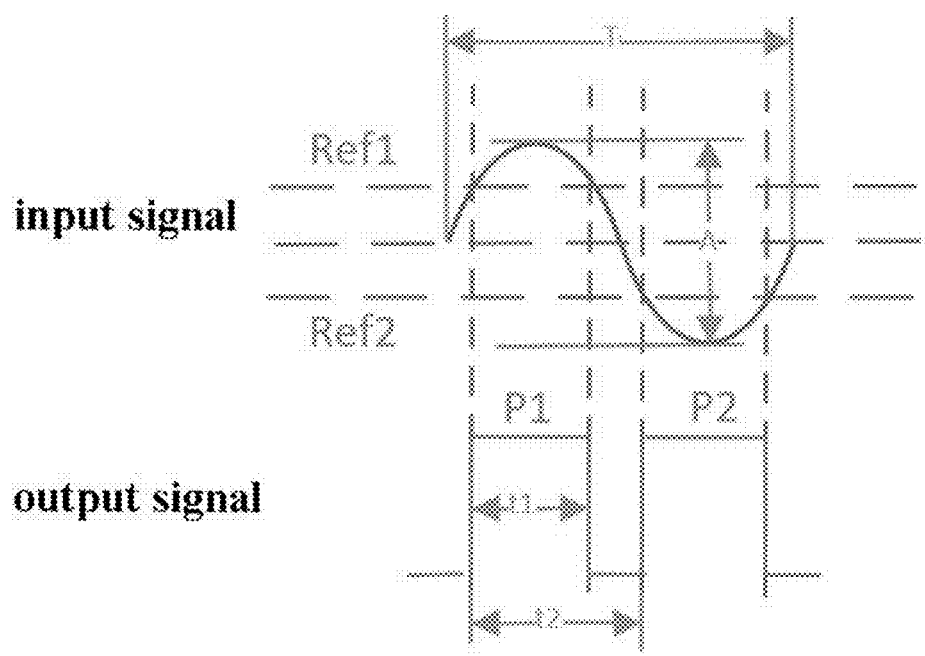
FIG. 6 shows an input signal from a piezoelectric sensor to the signal processing circuit and an output signal processed by the signal processing circuit.

FIG. 5 is an illustrative view of a signal processing circuit of the control circuit board in FIG. 4, while FIG. 6 shows an input signal from a piezoelectric sensor to the signal processing circuit and an output signal processed by the signal processing circuit.

As shown in FIGS. 4-6, in an embodiment, the control circuit board 200 may be connected to the piezoelectric sensor 100 by a wire. A hardware interface of the control circuit board 200 includes power supply, ground, and digital output signals. In an embodiment, the control circuit board 200 includes a signal processing circuit 210 and a controller 220. The signal processing circuit 210 is configured to process a detection signal output from the piezoelectric sensor 100. The controller 220 is adapted to determine whether the tap event is a correct human finger tap event based on the processed detection signal.

Still referring to FIGS. 4-6, in an embodiment, the signal processing circuit 210 comprises a filter 211, an amplifier 212, and one or more comparators 2131, 2132. The filter 211 is configured to filter out noise signals that do not satisfied a predetermined condition from the detection signal. For example, the filter 211 may filter out high-frequency vibration signals with a frequency higher than 2 KHz, because finger tapping frequency is usually below 2 KHz.

In an embodiment, the amplifier 212 is configured to amplify the filtered detection signal to a desired range. The comparators 2131, 2132 comprise an upper-threshold comparator 2131 with a predetermined upper-threshold voltage Ref1 and a lower-threshold comparator 2132 with a predetermined lower-threshold voltage Ref2. The upper-threshold comparator 2131 is configured to process the amplified detection signal into a first DC voltage digital signal P1, and the lower-threshold comparator 2132 is configured to process the amplified detection signal into a second DC voltage digital signal P2.

Figure 7:
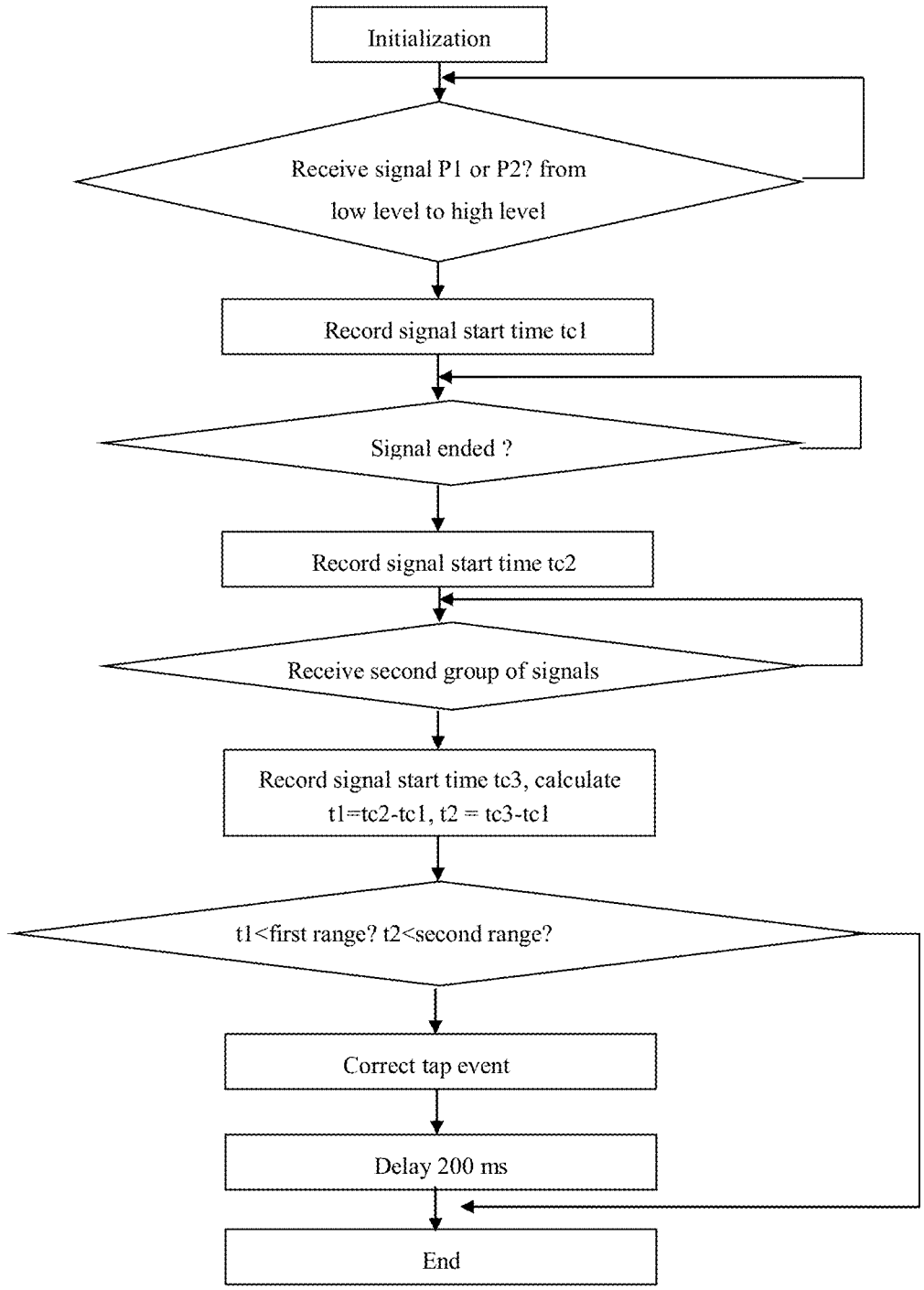
FIG. 7 shows the flow chart of a controller of the control circuit board in FIG. 4 to determine whether a tap event is a correct human finger tap event.

FIG. 7 shows the flow chart of a controller of the control circuit board 200 of FIG. 4 for determining whether a tap event is a correct human finger tap event.

With respect to FIGS. 4-7, in an embodiment, the controller 220 is adapted to calculate a first time difference t1 between an end time tc2 and a start time of the detected first DC voltage digital signal P1. The controller 220 is further adapted to calculate a second time difference t2 between the start time of the detected first DC voltage digital signal P1 and a start time of the second DC voltage digital signal P2 detected just after the detected first DC voltage digital signal P1. The controller 220 is adapted to determine whether the tap event is a correct human finger tap event based on the calculated first time difference t1 and the calculated second time difference t2.

As shown in FIGS. 4-7, in an embodiment, if the calculated first time difference t1 is within a first threshold range and the calculated second time difference t2 is within a second threshold range, then the controller 220 determines that the tap event is a correct human finger tap event. In an embodiment, if the calculated first time difference t1 exceeds the first threshold range or the calculated second time difference t2 exceeds the second threshold range, then the controller 220 determines that the tap event is not a correct human finger tap event. In an embodiment, the first threshold range is 300 μs~800 μs, and the second threshold range is 300 μs~1400 μs.

Still referring to FIGS. 4-7, in an embodiment, in a condition where the controller 220 determines that the tap event is a correct human finger tap event, if the first DC voltage digital signal P1 is detected by the controller 220 only once, then the controller 220 determines that the tap event is a single-click event. In an embodiment, in a condition where the controller 220 determines that the tap event is a correct human finger tap event, if the first DC voltage digital signal P1 is detected by the controller 220 twice and a time interval between two adjacent first DC voltage digital signals P1 detected by the controller 220 is within a third threshold range, the controller 220 determines that the tap event is a double-click event. In an embodiment, the third threshold range is 200 ms~500 ms, as the time interval of double-click of human finger is typically within a range of 200 ms~1 s.

Figure 2:
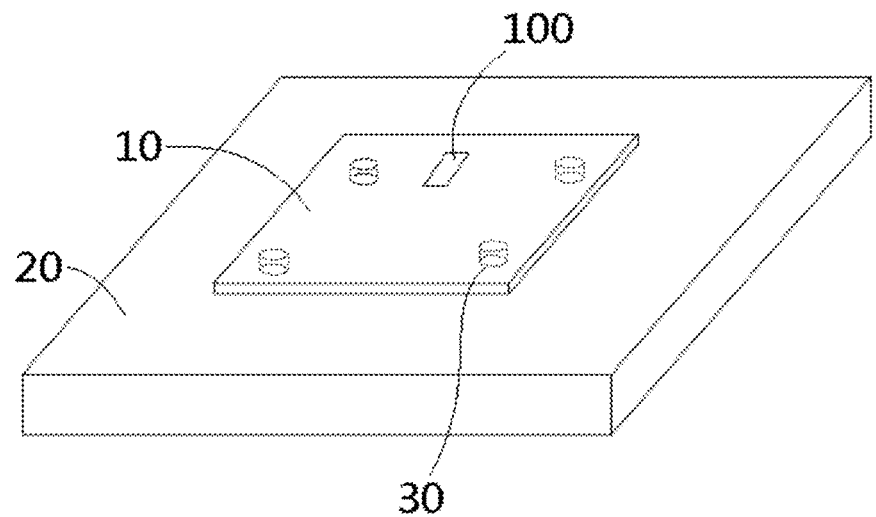
FIG. 2 is an illustrative view of a touch detection device according to another embodiment of the present disclosure.
Figure 3:
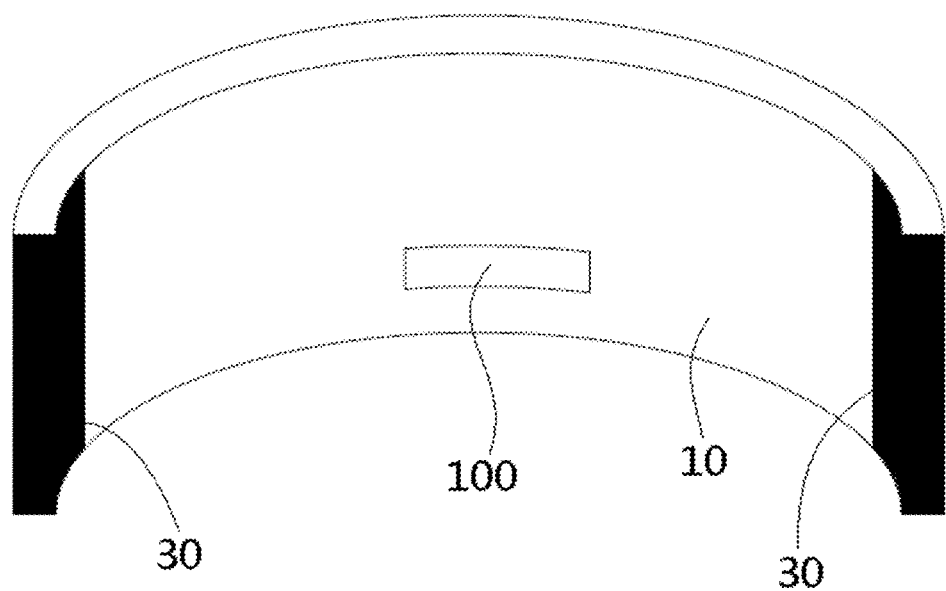
FIG. 3 is an illustrative view of a touch detection device according to yet another embodiment of the present disclosure.

FIG. 2 is an illustrative view of a touch detection device according to another embodiment of the present disclosure; FIG. 3 is an illustrative view of a touch detection device according to yet another embodiment of the present disclosure.

As shown in FIGS. 1-3, in an embodiment, the touch panel 10 is adapted to be mounted on a support body 20. The touch detection device further comprises an acoustic wave absorbing material 30 provided between the touch panel 10 and the support body 20. The acoustic wave absorbing material 30 is configured to acoustically isolate the touch panel 10 from the support 20, so as to prevent sound waves generated on the support body 20 from being transmitted to the touch panel 10.

As shown in FIGS. 1-3, in an embodiment, the support body 20 is formed as a housing. The touch panel 10 is embedded in an opening of the support body 20, and the acoustic wave absorbing material 30 is arranged at the periphery edge of the touch panel 10.

As shown in FIG. 2, in an embodiment, the touch panel 10 is supported on a surface of the support body 20, and the acoustic wave absorbing material 30 is provided on the bottom of the touch panel 10.

As shown in FIGS. 1-3, in an embodiment, the touch panel 10 may comprise a circular panel, a square panel or a curved surface panel.

As shown in FIGS. 1-3, in an embodiment, the touch panel 10 may be made of glass, stainless steel or wood.

The present application provides a sensor and a panel adapted to detect tap signals based on piezoelectric material, such as piezoelectric thin film and piezoelectric ceramic. A piece of piezoelectric material is mounted on a rigid panel. The shape of the panel may have a flat surface or any arbitrary three-dimensional surface. Sound absorbing material such as sound-absorbing foam or rubber is provided around the rigid panel to isolate the sound. When the finger taps the panel, the sound or mechanical wave generated by tapping is propagated along the hard panel to the position where the piezoelectric material is located. The piezoelectric material produces piezoelectric effect due to vibration, and generates charges on the upper and lower surface of the piezoelectric material. The piezoelectric material produces a voltage signal, and the generated voltage signal is amplified and filtered by a corresponding circuit, and then is processed by a specific algorithm to obtain a desired signal. When a region outside the panel is taped by the finger, the mechanical vibration of the panel is not transmitted to the location of the piezoelectric material because the sound-absorbing material prevents the mechanical vibration from being transmitted to the piezoelectric material, so the false trigger may be avoided.

In the present application, the piezoelectric sensor may be easily and directly mounted on a hard surface such as glass, mirror, stainless steel, and wood by surface mount technology (SMT), providing significant cost advantages. In addition, embodiments have restrictions on the shape and size of the panel, and the piezoelectric sensor may be mounted on any part of the panel. Further embodiments provide fewer restrictions and challenges on the design of the overall device under control, for example, household appliances.

In the present application, the tap or touching signal transmitted by the piezoelectric thin film sensor is processed by a hardware circuit into a digital signal related to the tap or touching force and the tap or touching frequency, and then the tap or touching signal is filtered through software algorithm to determine whether it is a human finger tap or touching event or a double-click event. Thereby, it may be very intelligent to complete the detection of human tap or touching, and may be used for different user experiences of household appliances.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A touch detection device, comprising:
   a touch panel;
   a piezoelectric sensor mounted on the touch panel and adapted to detect a tap event applied to the touch panel; and
   a control circuit board in electrical communication with the piezoelectric sensor, and including:
      a signal processing circuit adapted to process a detection signal output from the piezoelectric sensor, including:
         a filter for filtering out noise signals that do not satisfy a predetermined condition from the detection signal;
         an amplifier adapted to amplify the filtered detection signal to a desired range; and
         a comparator including an upper-threshold comparator with a predetermined upper-threshold voltage and a lower-threshold comparator with a predetermined lower-threshold voltage for processing the amplified detection signal into a first DC voltage digital signal and a second DC voltage digital signal; and
      a controller adapted to determine whether the tap event is a correct human finger tap event based on the processed detection signal.

2. The touch detection device according to claim 1, wherein the controller is further adapted to:
   calculate a first time difference between an end time and a start time of the detected first DC voltage digital signal;
   calculate a second time difference between the start time of the detected first DC voltage digital signal and a start time of the second DC voltage digital signal detected just after the detected first DC voltage digital signal; and
   determine whether the tap event is a correct human finger tap event based on the calculated first time difference and the calculated second time difference.

3. The touch detection device according to claim 2, wherein, if the calculated first time difference is within a first threshold range and the calculated second time difference is within a second threshold range, the controller determines that the tap event is a correct human finger tap event.

4. The touch detection device according to claim 3, wherein, if the calculated first time difference exceeds the first threshold range or the calculated second time difference exceeds the second threshold range, the controller determines that the tap event is not a correct human finger tap event.

5. The touch detection device according to claim 4, wherein the first threshold range is 300 μs~800 μs, and the second threshold range is 300 μs~1400 μs.

6. The touch detection device according to claim 3, wherein, in a condition where the controller determines that the tap event is a correct human finger tap event, if the first DC voltage digital signal is detected by the controller only once, the controller determines that the tap event is a single-click event.

7. The touch detection device according to claim 3, wherein, in a condition where the controller determines that the tap event is a correct human finger tap event, if the first DC voltage digital signal is detected by the controller twice and a time interval between two adjacent first DC voltage digital signals detected by the controller is within a third threshold range, the controller determines that the tap event is a double-click event.

8. The touch detection device according to claim 7, wherein the third threshold range is 200 ms-500 ms.

9. The touch detection device according to claim 1, wherein the touch panel is adapted to be mounted on a support body, and the touch detection device further includes an acoustic wave absorbing material adapted to be provided between the touch panel and the support body for acoustically isolating the touch panel from the support so as to prevent sound waves generated on the support body from being transmitted to the touch panel.

10. The touch detection device according to claim 9, wherein the support body is formed as a housing and the touch panel is embedded in an opening of the support body.

11. The touch detection device according to claim 10, wherein the acoustic wave absorbing material is arranged at the peripheral edge of the touch panel.

12. The touch detection device according to claim 10, wherein the touch panel is supported on a surface of the support body, and the acoustic wave absorbing material is provided on a bottom of the touch panel.

13. The touch detection device according to claim 1, wherein the touch panel comprises a circular panel, a square panel or a curved surface panel.

14. The touch detection device according to claim 1, wherein the touch panel is made of glass, stainless steel or wood.

15. The touch detection device according to claim 1, wherein the piezoelectric sensor is a piezoelectric thin film sensor or a piezoelectric ceramic sensor.

16. A touch detection device, comprising:
    a touch panel including a sensor adapted to detect a tap event applied to the touch panel;
    a signal processing circuit operatively connected to the sensor for receiving and processing a detection signal output from the sensor; and
    a controller for determining whether the tap event is a correct human finger tap event based on the processed detection signal, the controller, in response to the receipt of a first DC voltage signal and a second DC voltage signal generated by the signal processing circuit, adapted to:
        calculate a first time difference between an end time and a start time of the detected first DC voltage digital signal;
        calculate a second time difference between the start time of the detected first DC voltage digital signal and a start time of the second DC voltage digital signal detected just after the detected first DC voltage digital signal; and
        determine whether the tap event is a correct human finger tap event based on the calculated first time difference and the calculated second time difference.

17. The touch detection device according to claim 16, wherein the controller determines that the tap event is a correct human finger tap event if the calculated first time difference is within a first threshold range and the calculated second time difference is within a second threshold range.

18. The touch detection device according to claim 17, wherein the controller determines that the tap event is not a correct human finger tap event if the calculated first time difference exceeds the first threshold range or the calculated second time difference exceeds the second threshold range.

19. The touch detection device according to claim 16, wherein the controller is further adapted to:
    determine that the tap event is a single-click event when the controller determines that the tap event is a correct human finger tap event and the first DC voltage digital signal is detected by the controller only once; and
    determine that the tap event is a double-click event when the controller determines that the tap event is a correct human finger tap event, and the first DC voltage digital signal is detected by the controller twice and a time interval between two adjacent first DC voltage digital signals detected by the controller is within a third threshold range.

20. A touch detection device, comprising:
    a touch panel;
    a sensor mounted on the touch panel and adapted to detect a tap event applied to the touch panel; and
    a control circuit board in electrical communication with the sensor, and including:
        a signal processing circuit processing a detection signal output from the sensor, the signal processing circuit adapted to:
            compare the detection signal to a first reference for generating a first processed signal; and
            compare the detection signal to a second reference, distinct from the first reference, for generating a second processed signal; and
        a controller determining whether the tap event is a correct human finger tap event based on characteristics of the first and second processed signals, wherein the characteristics of the first and second processed signals include time information, and the controller is adapted to:
            calculate a first characteristic indicative of a duration of the first processed signal;
            calculate a second characteristic indicative of a duration between a start time of the first processed signal and a start time of the second processed signal; and
            determine whether the tap event is a correct human finger tap event based on the first characteristic and the second characteristic.

* * * * *